United States Patent [19]

Ogasawara

[11] Patent Number: 5,581,215
[45] Date of Patent: Dec. 3, 1996

[54] VOLTAGE CONTROLLED OSCILLATOR HAVING FREQUENCY AND AMPLITUDE CONTROLLING LOOPS

[75] Inventor: Hiroshi Ogasawara, Sendai, Japan

[73] Assignee: Motorola, Inc., Schaumburg, Ill.

[21] Appl. No.: 492,559

[22] Filed: Jun. 20, 1995

[30] Foreign Application Priority Data

Jun. 23, 1994 [JP] Japan .................................. 6-166083

[51] Int. Cl.$^6$ ...................................... H03B 5/24
[52] U.S. Cl. ..................... 331/45; 331/108 B; 331/109; 331/135; 331/177 R; 331/183
[58] Field of Search ..................................... 331/135, 137, 331/108 B, 177 R, 45, 109, 183

[56] References Cited

U.S. PATENT DOCUMENTS

| 4,994,763 | 2/1991 | Chen et al. | 331/135 |
|---|---|---|---|
| 5,459,438 | 10/1995 | Mirow | 331/135 |

*Primary Examiner*—Siegfried H. Grimm
*Attorney, Agent, or Firm*—Rennie William Dover; Harry A. Wolin

[57] ABSTRACT

A voltage controlled oscillator that completely eliminates the need for any externally mounted coil and capacitor includes a first loop and a second loop. The first loop provides band-limiting of an output signal of an amplifier through a bandpass filter to provide oscillation at a frequency of a resonant point of the bandpass filter, and the second loop controls the oscillation amplitude, so that a lowpass filter output with a 90° phase is extracted from the first loop, while a bandpass filter output with a 0° phase is extracted from the second loop. The voltage controlled oscillator may be used in an automatic fine tuning circuit for television.

8 Claims, 5 Drawing Sheets

VOLTAGE CONTROLLED OSCILLATOR HAVING FREQUENCY AND AMPLITUDE CONTROLLING LOOPS

BACKGROUND OF THE INVENTION

The present invention relates to a voltage controlled oscillator circuit used in communication units such as television sets and radio units and to an automatic fine tuning circuit for television.

Figure 8:
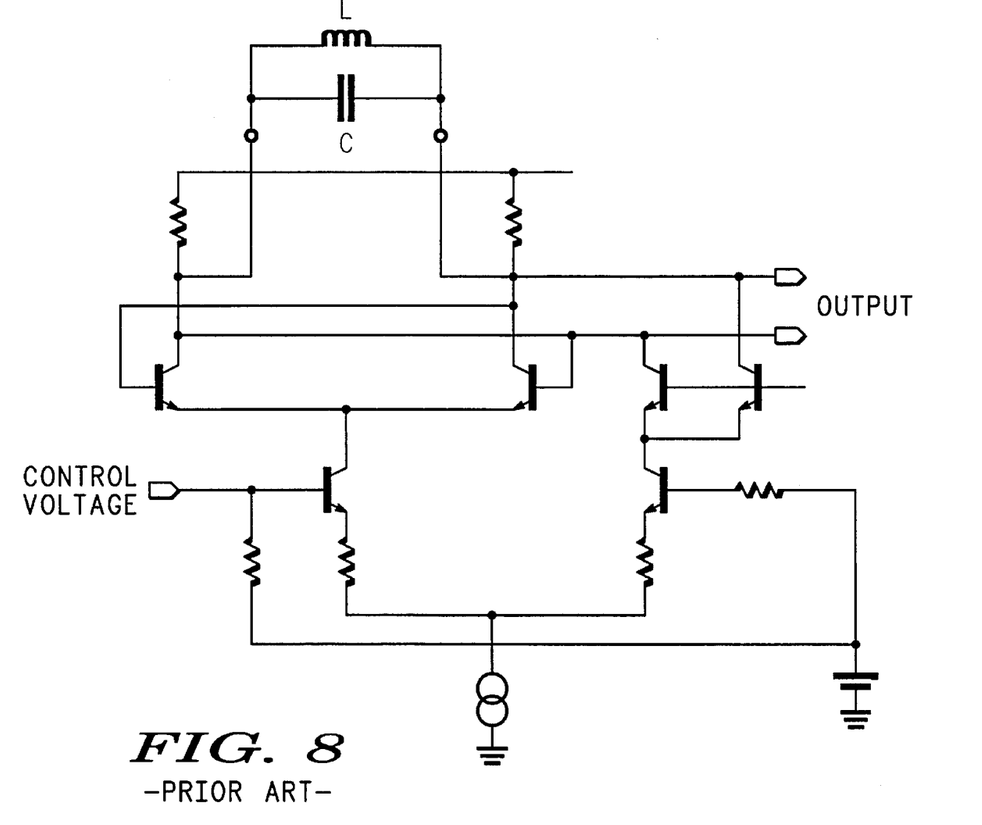
FIG. 8 is an explanatory diagram depicting one example of prior art voltage controlled oscillator.

A conventional voltage controlled oscillation circuit for television, for example, is comprised of a coil L and a capacitor C as shown in FIG. 8, so that its oscillation frequency is determined by constants of the coil L and capacitor C. Transistors, resistors and other components that form the circuit are fabricated integrally on a printed circuit (PC) board; however, the coil L and capacitor C that determines the oscillation frequency are mounted externally to the PC board.

Figure 9:
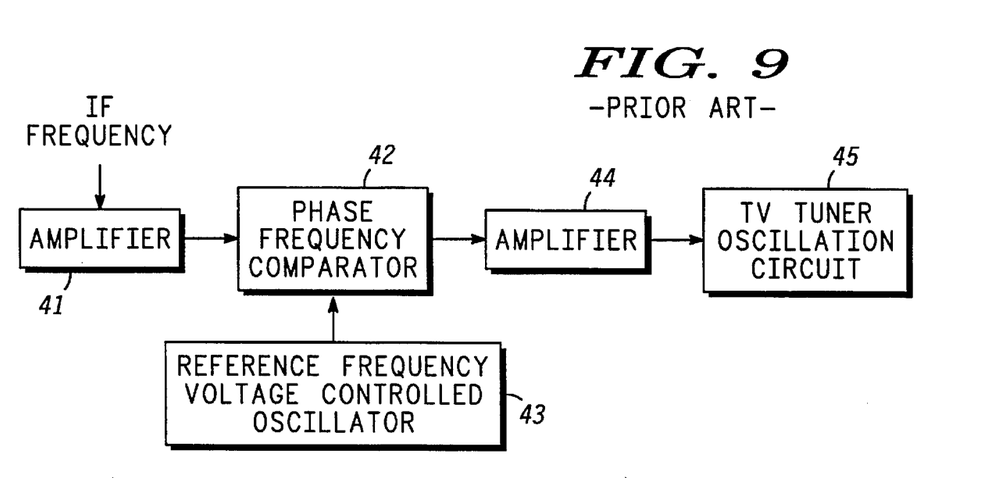
FIG. 9 is an explanatory diagram depicting one example of prior art automatic fine tuning circuit for television.

On the other hand, a conventional automatic fine tuning circuit for television has an amplifier 41 for amplifying a TV intermediate frequency (IF) signal; a phase frequency comparator 42 for outputting an error signal corresponding to a phase frequency difference between the TV intermediate frequency from the amplifier 41 and a reference frequency; a voltage controlled oscillator circuit 43 for generating the reference frequency; and an amplifier 44 for amplifying the error signal, as shown in FIG. 9, wherein a TV tuner oscillation circuit 45 is automatically adjusted so that the oscillation frequency is kept constant by the error signal amplified by the amplifier 44.

However, with the conventional voltage controlled oscillator circuit of FIG. 8, because it is necessary to externally mount on the PC board the coil L and capacitor C that determine the oscillation frequency, two additional connection pins are required for circuit integration, which poses an impediment to miniaturization of the PC board. In addition, unwanted emission from the IC connection pins and coil L has adverse effects on an audio signal tuner and so on, and as such, a shield and pattern design for preventing such effects is considerably complex.

With the conventional automatic fine tuning circuit for TV shown in FIG. 9, because it is necessary to externally mount coil L and capacitor C in the voltage controlled oscillator 43 that generates the reference frequency, as in FIG. 8, the coil must be exactly adjusted to keep AFT (automatic fine tuning) accuracy to below 0.2% at worst, thus requiring a burdensome adjustment process. Also because the coil L is externally mounted, unwanted emission from the coil L and IC connection pins has adverse effects on the audio signal tuner and so on, thereby resulting in beat interference on certain channels. It would also be considerably difficult to design a shield for the tuner and a pattern for the PC board to prevent such adverse effects.

As such, the inventor attempted to contemplate a means for automatically controlling the oscillation frequency of a TV tuner oscillation circuit 45 to a constant level, wherein a TV intermediate frequency signal of an amplifier 41 is directly divided by a divider into a reference frequency $f_{ref}$ and inputted into a phase frequency comparator 42, so that an error signal from the phase frequency comparator 42 is used to maintain constant the oscillation frequency of the TV tuner oscillation circuit 45. In this case, however, when a crystal oscillation circuit is used as a means to generate a reference frequency $f_{ref}$, a value of the crystal becomes specific in order to simplify the divider, which results in a higher cost. On the other hand, a standard crystal such as 3.579454 MHz (standard for a color signal) is used, the resulting division ratio is greater, which increases the scale of the circuit. Especially, when the intermediate frequency is 58.75 MHz (NTSC in Japan), it was found that high-speed logic (such as ECL) must be used, which would result in increased circuit current.

The first purpose of the present invention is to provide a voltage controlled oscillator circuit that completely eliminates the need for any externally mounted coil and capacitor. The second purpose of the present invention is to provide an automatic fine tuning circuit for television with low cost and high accuracy by use of a voltage controlled oscillator circuit that eliminates the need for any externally mounted coil and capacitor.

SUMMARY OF THE INVENTION

A voltage controlled oscillator circuit is provided which comprises a first loop for band-limiting an output signal of an amplifier through a bandpass filter, thereby providing oscillation at a frequency of a resonant point of the bandpass filter; and a second loop for controlling oscillation amplitude, wherein a lowpass filter output with a 90° phase is extracted from the first loop, while a bandpass filter output with a 0° phase is extracted from the second loop.

A voltage controlled oscillator circuit is provided wherein the first loop has a first amplifier, a second filter connected to the first amplifier, a second filter connected to the first filter, and a first feedback circuit for feeding back the output of the second filter to the input of the first amplifier, and wherein the second loop has a second amplifier for amplifying the output of the second filter, and a second feedback circuit for feeding back the output of the second amplifier to the input of the second amplifier via the second filter.

An automatic fine tuning circuit for television is provided which comprises: a TV intermediate frequency divider; a phase frequency comparator for outputting an error signal corresponding to a phase frequency difference between the divided frequency from the divider and a reference frequency; and a voltage controlled oscillator circuit for generating the reference frequency, wherein said divider performs divide-by-N and divide-by-(N+1) operations selected according to a ratio of the TV intermediate frequency and reference frequency, multiple times, respectively, and outputs an average of both divisions as its divided frequency such that the average is close to the reference frequency, and wherein a TV tuner oscillation circuit is automatically controlled by the error signal from said phase frequency comparator so that the oscillation frequency is maintained constant.

With the voltage controlled oscillator circuit, the output signal of the amplifier is band-limited by the bandpass filter to provide oscillation at a frequency of a resonant point of the bandpass filter in the first loop. In the second loop, the oscillation amplitude is controlled to a constant level. A lowpass filter output with a 90° phase is extracted from the first loop, while a bandpass filter output with a 0° phase is extracted from the second loop. Thus, two outputs 90° out of phase with each other are obtained, while providing stable oscillation with a constant oscillation frequency and oscillation amplitude.

With the automatic fine tuning circuit for television, the divider performs divide-by-N and divide-by-(N+1) operations selected according to a ratio of the TV intermediate frequency and reference frequency, multiple times, respectively, and outputs an average of both divisions as its divided frequency such that the average is close to the reference frequency. Thus, the oscillation frequency of the TV tuner oscillation circuit can be controlled to a constant level with a high degree of accuracy.

BRIEF DESCRIPTION OF THE INVENTION

DETAILED DESCRIPTION OF THE INVENTION

Figure 1:
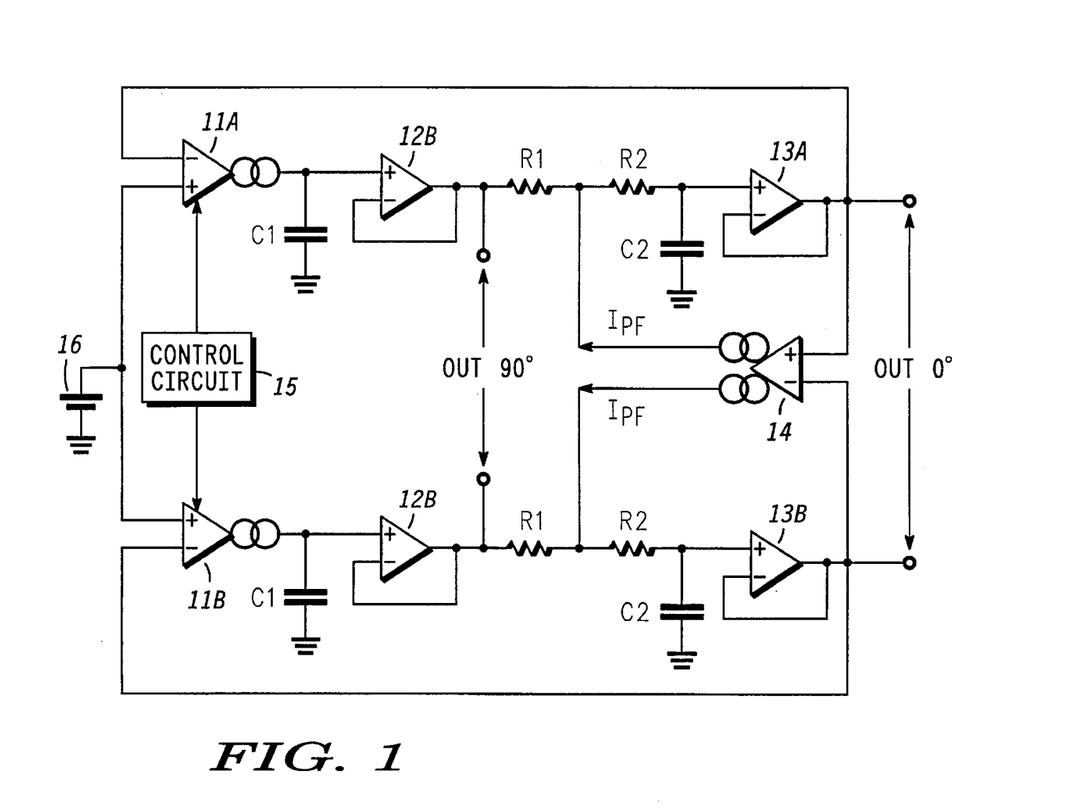
FIG. 1 is an explanatory diagram depicting an embodiment of a quasi-differential voltage controlled oscillator circuit.

Embodiments of the present invention will be described hereinbelow. An embodiment in FIG. 1 shows a quasi-differential voltage controlled oscillator circuit (VCO), wherein a capacitor C1, a buffer amplifier 12A, resistors R1 and R2, a capacitor C2, and a buffer amplifier 13A are connected between an output end and an input end of one of first current amplifiers 11A, thereby forming a first loop. This first loop comprises a bandpass filter (BPF), which limits the band to provide oscillation at a frequency of a resonant point of the bandpass filter. It should be appreciated that an emitter-follower may be employed in place of the buffer amplifiers 12A and 13A. The capacitor C1 and resistor R1 form a first filter, while the capacitor C2 and resistor R2 form a second filter. The other one of first current amplifiers 11B is identically configured. To a non-inverting input terminal (+) of the first current amplifiers 11A and 11B is connected a power supply 16.

To an output end of one buffer amplifier 13A is connected a non-inverting input terminal (+) of the second current amplifier 14, the output of which is connected to a node between the first and second filters on the one side, i.e., a node between the resistors R1 and R2, thereby forming one of the second loops. To an output end of the other buffer amplifier 13B is connected an inverting input terminal (−) of the second current amplifier 14, the output of which is connected to a node between the resistors R1 and R2 on the other side, thereby forming the other one of the second loops. From two output terminals of the second current amplifier 14 are provided currents with equal magnitude and opposite phase. And, a 0°-phase oscillation output, OUT0°, is derived between the two input terminals of the second current amplifier 14. These second loops regulate the magnitude of oscillation amplitude at OUT0° to a constant level.

A 90°-phase oscillation output, OUT90°, is derived between the output terminals of the buffer amplifiers 12A and 12B. The output end of the buffer amplifier 13A is connected to the input end of the first current amplifier 11A to form a first feedback circuit, while the output end of the second current amplifier 14 is connected to the node between the resistors R1 and R2 to form a second feedback circuit.

According to the filter theory, OUT0° provides a bandpass filter (BPF) output, which produces a 0°-phase output at the oscillation frequency. On the other hand, OUT90° provides a lowpass filter (LPF) output, which produces a 90°-phase output at the oscillation frequency. Note that the oscillation frequency, $f_{OSC}$, and the bandwidth of the oscillator, denoted by Q, are given by:

$$f_{OSC} = (1/2\pi)[RE1 \cdot C1 \ (Re2+R1+R2) \ C2]^{-1/2} \quad Q = [(Re2+R1+R2) \ C2/(RE1 \cdot C1)]^{1/2}$$

where RE1 denotes output impedance of the current amplifiers 11A and 11B, and Re2 denotes output impedance of the buffer amplifiers 12A and 12B.

The oscillation amplitude, $V_0$, is determined by a product of the output current $I_{PF}$ from the second current amplifier and (R1+Re2), that is, $V_0 = I_{PF} \times (R1+Re2)$.

Note that the oscillation-frequency $f_{OSC}$ may be variably adjusted by controlling the currents of the first current amplifiers 11A and 11B with the control circuit 15 to vary the output impedance RE1.

Figure 2:
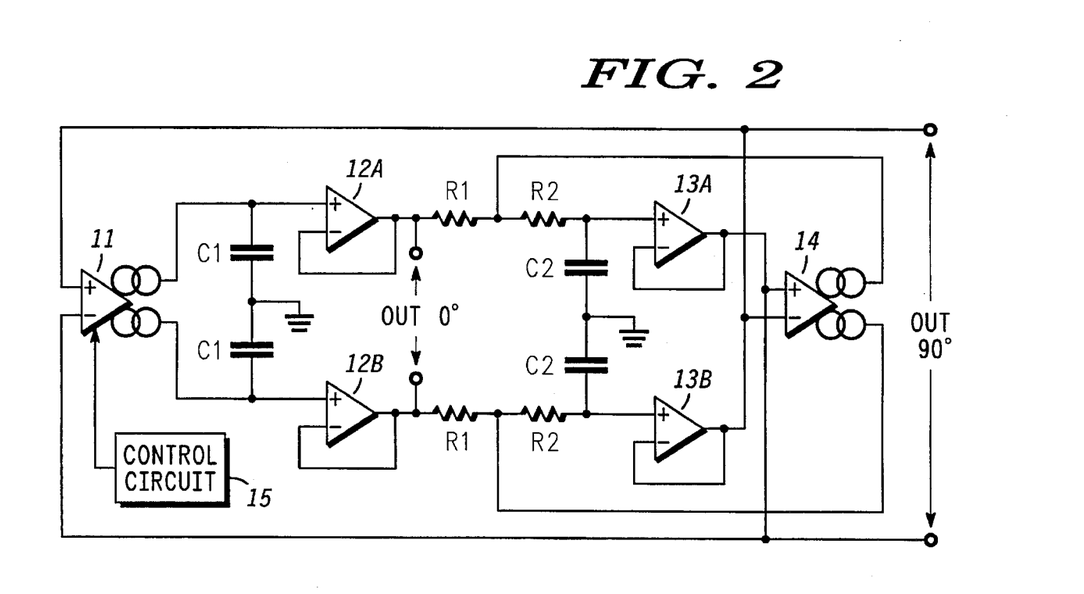
FIG. 2 is an explanatory diagram depicting an embodiment of a full-differential voltage controlled oscillator circuit.

An embodiment in FIG. 2 shows a full-differential voltage controlled oscillator circuit (VCO), which is configured similar to the embodiment of FIG. 1, except that the first current amplifier 11 is commonly shared and the power supply 16 is eliminated; the oscillation frequency $f_{OSC}$, the bandwidth of the oscillator denoted by Q, and oscillation amplitude $V_0$ are determined in a similar manner to the embodiment of FIG. 1.

Figure 3:
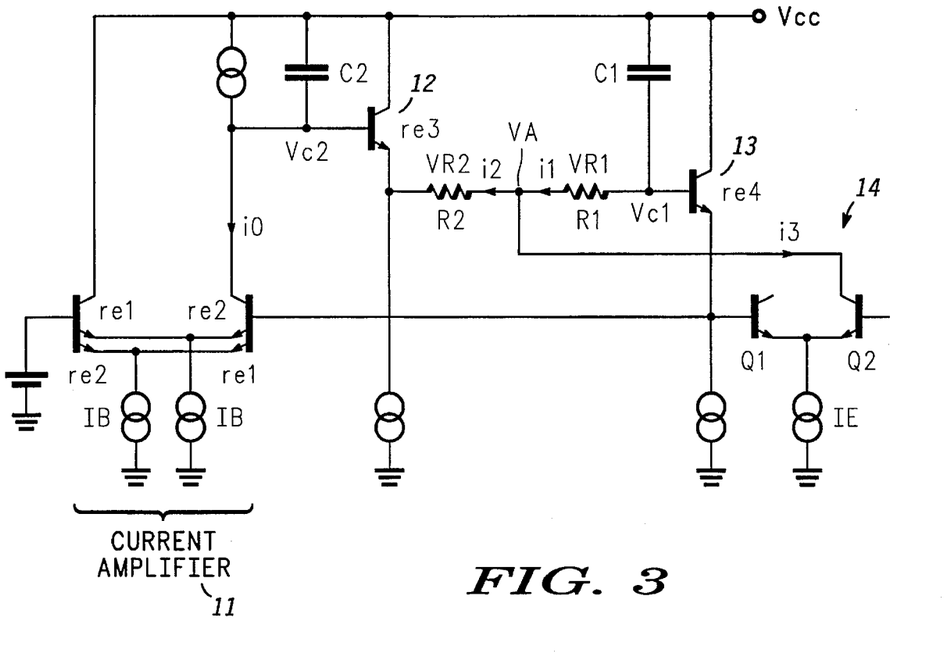
FIG. 3 is an explanatory diagram depicting an embodiment of a single-type voltage controlled oscillator circuit.
Figure 4:
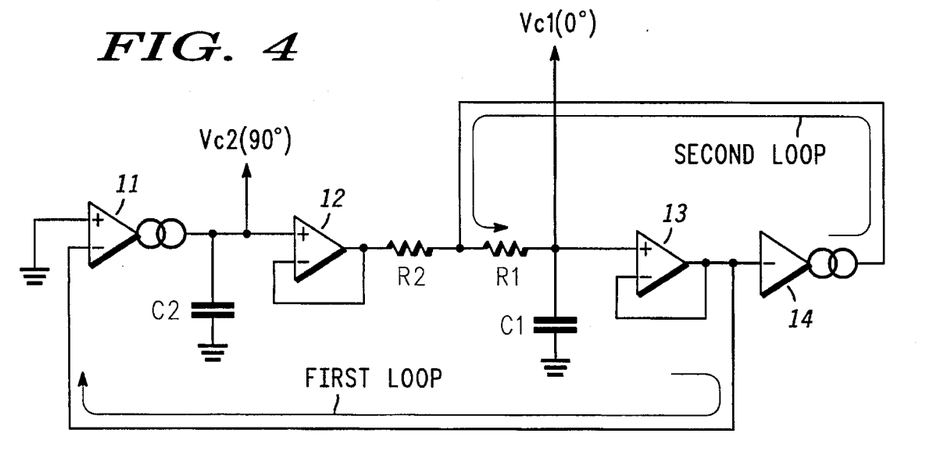
FIG. 4 is an explanatory diagram depicting an equivalent circuit of the single-type voltage controlled oscillator of FIG. 3.
Figure 5:
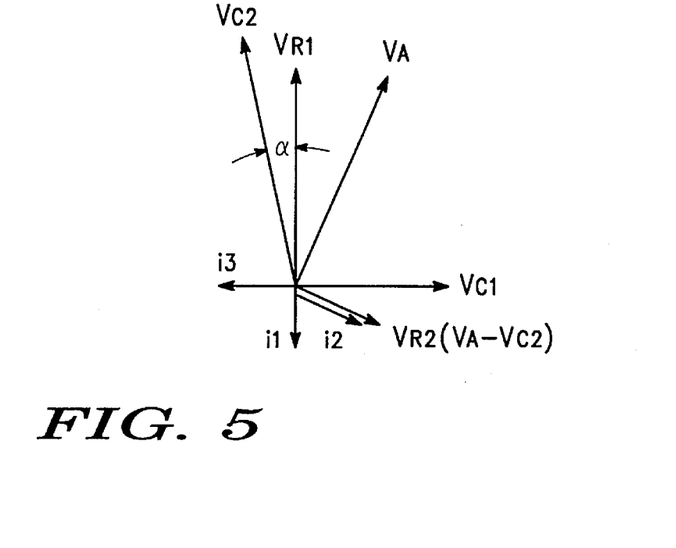
FIG. 5 is a vector diagram for currents and voltages in the single-type voltage controlled oscillator circuit of FIG. 3.

An embodiment in FIG. 3 shows a single-type voltage controlled oscillator (VCO); FIG. 4 depicts its equivalent circuit; and FIG. 5 depicts a vector diagram for currents and voltages. In FIG. 5, $\alpha$ denotes a phase shift for the current amplifier 11. This embodiment is configured by dividing the quasi-differential voltage controlled oscillator circuit shown in FIG. 1 into upper and lower stages, and employing either one of the stages. Note that transistors Q1 and Q2 provide limiting operation.

Now, let us determine oscillation requirements for this voltage controlled oscillator circuit. This circuit oscillates when $vC2 \cos\alpha > vR1$. Assuming $\alpha = 0°$, then it oscillates when $vC2 > vR1$, where a phase difference between vC1 and vC2 is 90°.

From FIG. 3, the following equations are given:

$$vC1 = -i1 \ ZC1 \ (\text{where } ZC1 = 1/j\omega C1) \quad (1)$$

$$vC2 = -i0 \ ZC2 \ (\text{where } ZC2 = 1/j\omega C2) = -vC1 \ (1/Re) \ ZC2 \quad (2)$$

(where Re denotes output impedance of current amplifier 11.)

Substituting Eq. (1) into Eq. (2) yields:

$$vC2 = (i1 \ ZC1 ZC2)/Re$$

On the other hand, the following relationships hold true:

$$vA = -i1 \ (R1+ZC1)$$

$$vR2 = vA - vC2 = -i1 \ (R1+ZC1) - (i1 \ ZC1 ZC2)/Re = -i1 \ (R1+ZC1+ZC1ZC2/Re) \quad (3)$$

$$i2 = vR2/(R2+re3) = [-i1/(R2+re3)] \cdot (R1+ZC1+ZC1ZC2/Re) \quad (4)$$

Because transistors Q1 and Q2 provide limiting operation, it can be assumed that:

$$i3 = -IE \quad (5)$$

Given Eqs. (4) and (5):

$$i1 = i3 + i2 = -IE - [i1/(R2+re3)] \cdot (R1+ZC1+ZC1ZC2/Re)$$

When manipulated for i1, we obtain:

$$i1 = -IE \left[1 + (R2+re3) - 1(R1+ZC1+ZC1ZC2/Re)\right]^{-1}$$

Now, replacing $j\omega = s$ yields:

Numerator of $i1 = -IE\, s2\, (R2+re3)\, Re\, C1\, C2$

Denominator of $i1 = 1 + sRe\, C2 + s2\, (R1+R2+re3)Re\, C1\, C2 \quad (6)$

By substituting Eq. (6) into Eq. (1), we obtain:

Numerator of $vC1 = IE\, (R2+re3)\, sRe\, C2 = IE\, (R2+re3)\, j\omega Re\, C2$

Denominator of $vC1 = 1 + sRe\, C2 + s2\, (R1+R2+re3)\, Re\, C1\, C2 = 1 + j\omega Re\, C2 + (j\omega)2\, (R1+R2+re3)\, Re\, C1\, C2 \quad (7)$ In Eq. (7), at the resonant point, $$1 - \omega C2\, (R1+R2+re3)\, Re\, C1\, C2 = 0$$

Thus, the resonant frequency, fC, is given by:

$$fC = \omega C/2\pi = (1/2\pi)\, [(R1+R2+re3)\, Re\, C1\, C2]^{-\tfrac{1}{2}}$$

Q is given by $Q = [(R1+R2+re3)\, C1/Re\, C2]^{\tfrac{1}{2}}$.

The oscillation amplitude vOSC1 is given by vOSC1=IE (R2+re3).

From Eq. (7), vC1 output provides a bandpass filter (BPF) output, and its phase is 0°.

On the other hand, given Eqs. (2) and (7):

Numerator of $vC2 = -IE\, (R2+re3)$

Denominator of $vC2 = 1 + j\omega Re\, C2 + (j\omega)2\, (R1+R2+re3)\, Re\, C1\, C2$ From this equation, vC2 output provides a low-pass filter (LPF) output, and its phase is 90°.

Judging from the above circuit analysis, according to the voltage controlled oscillator circuit of the embodiments in FIGS. 3 and 4, two outputs with 0° and 90° phases can be obtained, while providing stable oscillation with a constant oscillation frequency and amplitude, without using any external coil and capacitor. Thus, the need for externally mounting coils and capacitors onto a PC board as conventionally done is completely eliminated, thereby allowing for a reduction in PC board size. In addition, because no problem of unwanted emission from coils and so on arises, it would not adversely affect the TV audio signal tuner, for example, thus eliminating the need for any shield and pattern design that prevents adverse influence due to unwanted emission.

Although the circuit analysis of the voltage controlled oscillator circuits shown in FIGS. 1 and 2 is omitted here, a similar circuit analysis as described above would demonstrate that two outputs with 0° and 90° phases, respectively, could be obtained while providing stable oscillation with a constant oscillation frequency and amplitude.

It should be appreciated that the voltage controlled oscillator circuit of the present invention may be applicable not only to television, but also to radio and other communication units.

Figure 6:
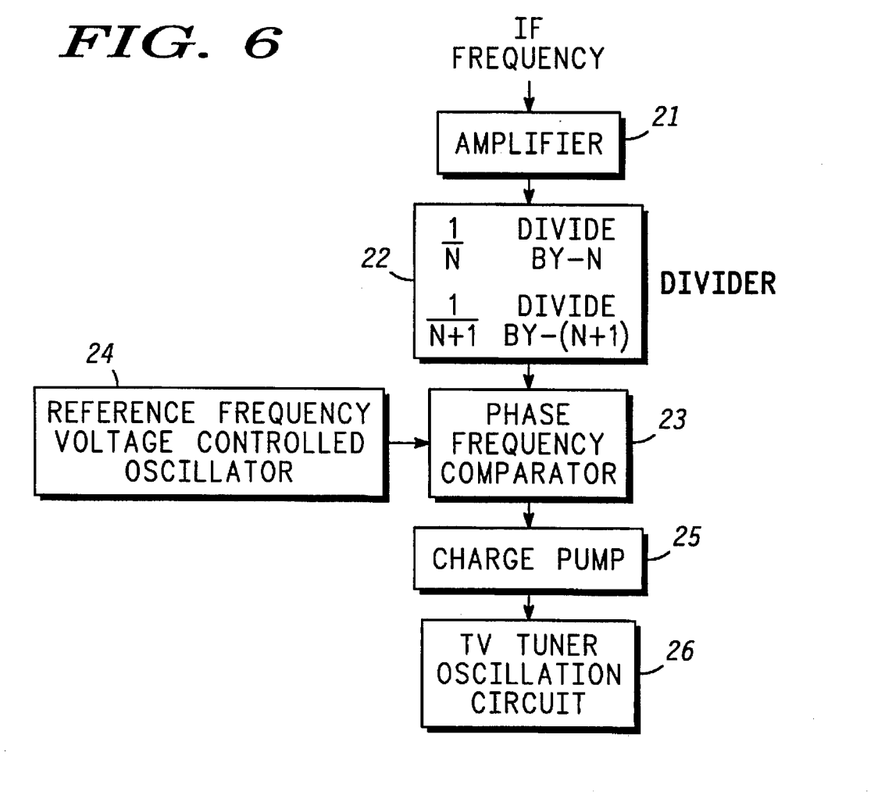
FIG. 6 is an explanatory diagram depicting an automatic fine tuning circuit for television.

Next, an automatic fine tuning circuit for television will be described. FIG. 6 depicts an embodiment of an automatic fine tuning circuit for television, wherein the television intermediate frequency (IF) is amplified by an amplifier 21 and then divided by an IF divider 22. This divider 22 performs, multiple times, divide-by-N and divide-by-(N+1) operations selected according to a ratio of the TV intermediate frequency, IF, and a reference frequency, $f_{ref}$, and outputs as its divided frequency an average of both divisions such that the average is close to the reference frequency $f_{ref}$. As the reference frequency $f_{ref}$, the frequency of the color signal (3.579454 MHz, in Japan) may be used, for example.

The divided frequency from this divider 22 is fed into a phase frequency comparator 23, which compares the divided frequency with the reference frequency $f_{ref}$ from a voltage controlled oscillator 24 which generates the reference frequency $f_{ref}$, and outputs an error signal corresponding to the resulting phase frequency difference therebetween. The error signal is boosted by a charge pump 25, and then fed as a control signal to a television tuner oscillation circuit 26 so that the oscillation frequency of the oscillation circuit 26 is automatically controlled to be constant. As the voltage controlled oscillator circuit 24, a voltage controlled oscillator circuit according to the present invention as shown in FIGS. 1–4 may be employed; alternatively, a standard crystal oscillator configured without any external coil and capacitor may also be used.

More specifically about the divider 22, the television intermediate frequency IF is 58.75 MHz and the reference frequency $f_{ref}$ of the color signal is 3.579454 MHz in Japan; a ratio of the frequencies is 16.41312. Then, assuming that N is equal to 16 in the present embodiment, divide-by-16 and divide-by-17 operations are performed multiple times, respectively, to output an average of both divisions as its divided frequency. The numbers of divide-by-16 and divide-by-17 operations, respectively, are set so that the divided frequency as an average from the divider 22 is close to the reference frequency $f_{ref}$.

To change the division ratio with a 5-bit down-counter, for example, divided-by-16 and divide-by-17 operations are performed 19 times and 13 times, respectively, with the total number of divisions at $2^5=32$. In this case, the divided frequency averaged from the divider 22 is given by:

$$[(D-F) \times N + F \times (N+1)]/D \quad = \quad (19 \times 16 + 13 \times 17)/32$$
$$= \quad 16.40625$$

Thus, it is close to the actual frequency ratio, 16.41312. It should be noted here that D denotes the total number of divisions and F denotes the number of divide-by-(N+1) operations.

Therefore, the frequency divided by 16.40625 from the divider 22 (approximately 3.580952 MHz) is substantially equivalent to the reference frequency $f_{ref}$ (3.579454 MHz).

Figure 7:
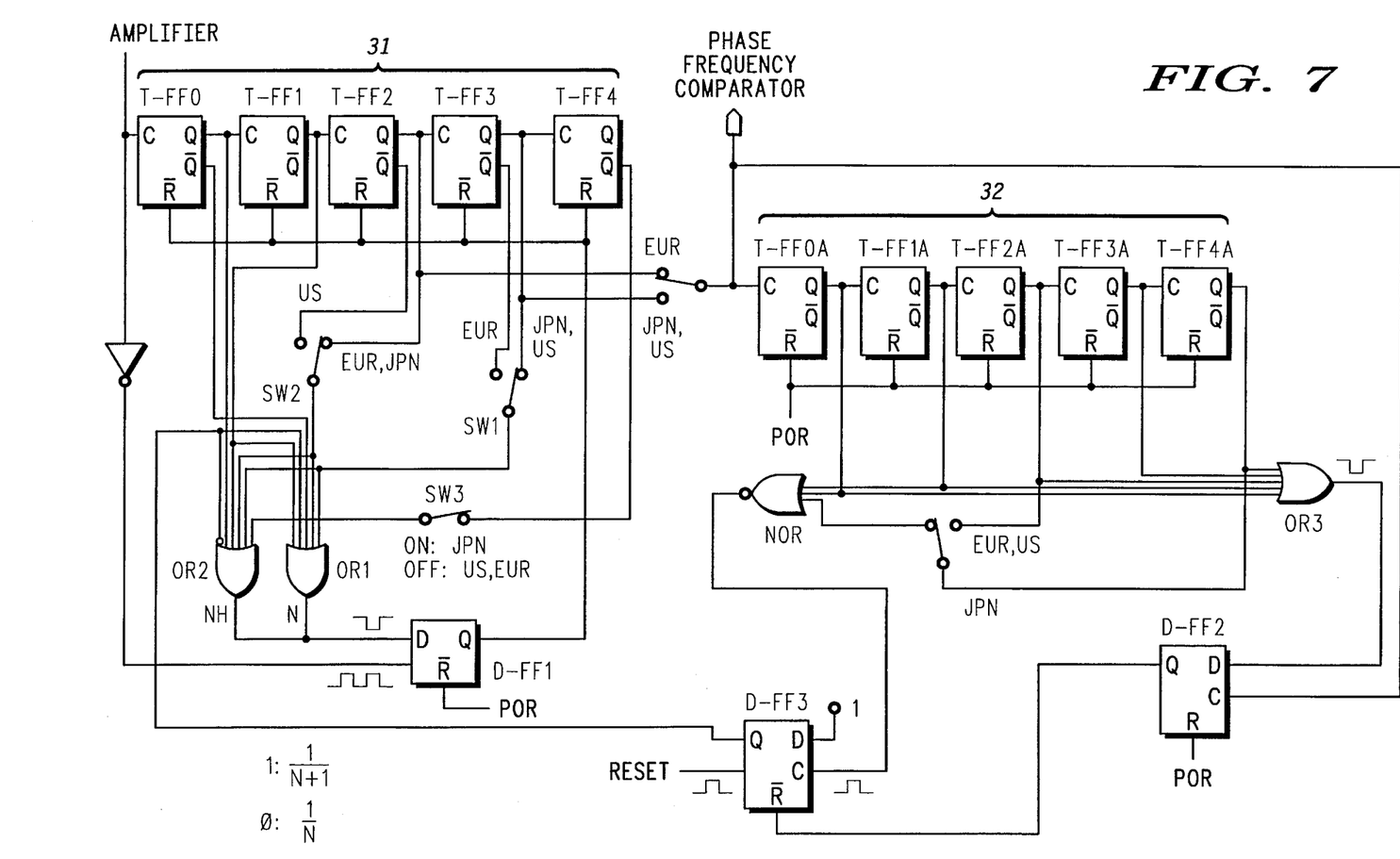
FIG. 7 is an explanatory diagram depicting a specific example of the divider 22.

FIG. 7 depicts a specific example of divider 22, which comprises a fractional N counter. Reference numeral 31 denotes a main counter, which selectively performs divide-by-N and divide-by-(N+1) operations, and includes five T flip-flops T-FF0 to T-FF4; an OR circuit, OR1, for divide-by-N; an OR circuit, OR2, for divide-by-(N+1); and a D flip-flop, D-FF1, for switching between divide-by-N and divide-by-(N+1). This embodiment is designed to be selectable with switches SW1–SW3 so that three types of television IF frequencies may be supported for use in Japan (JPN), Europe (EUR), and U.S. (US).

Reference numeral 32 denotes a sub-counter, or a circuit for switching the division ratio, which determines how many times divide-by-N and divide-by-(N+1) operations should be performed, respectively; the sub-counter 32 includes the same five T flip-flops T-FF0A to T-FF4A as used in the main counter 31; an OR circuit, OR3; a NOR circuit, NOR, for resetting in synchronization with a synchronous clock; a D flip-flop, D-FF2; and a D flip-flop, D-FF3, for outputting a control signal to switch between divide-by-N and divide-by-(N+1). The D flip-flop, D-FF3, is operative at a rising edge of a pulse after incrementing the numerator by 1.

Next, evaluations of an error signal outputted from the phase frequency comparator are described where the three types of television IF frequencies for JPN, EUR, and US are actually divided by the divider 22.

For JPN, the intermediate frequency $f_P$ is 58.75 MHz and the reference frequency $f_{ref}$ is 3.579454 MHz; so the ratio of the frequencies, $f_P/f_{ref}$, is 16.41312. Now assuming that the total number of divisions, D=32, 1/N=1/16, 1/(N+1)=1/17, and the number of divide-by-(N+1) operations F=13, and also assuming that 19 divide-by-16 operations and 13 (F=13) divide-by-17 operations are performed with the 5-bit divider 22, then automatic fine tuning (AFT) with a high degree of accuracy can be achieved with an error signal ratio of 0.04187% and an error signal frequency of 24.6 KHz. Alternatively, even if the number of bits is reduced to 3, with D=5, 1/N=1/16, 1/(N+1)=1/17, and F=2, and three divide-by-16 operations and two (F=2) divide-by-17 operations are performed, then practicable AFT can be implemented, though with a slightly lower degree of accuracy, resulting in an error signal ratio of 0.0799% and an error signal frequency of 47.0 KHz.

For US, the intermediate frequency $f_P$ is 45.75 MHz and the reference frequency $f_{ref}$ is 3.579454 MHz; so the ratio of the frequencies, $f_P/f_{ref}$, is 12.78128. Now assuming that the total number of divisions, D=32, 1/N=1/12, 1/(N+1)=1/13, and the number of divide-by-(N+1) operations F=25, and also assuming that 7 divide-by-12 operations and 25 (F=25) divide-by-13 operations are performed with the 5-bit divider 22, then AFT with a high degree of accuracy can be achieved with an error signal ratio of 0.00023% and an error signal frequency of 0.105 KHz. Alternatively, even if the number of bits is reduced to 3, with D=5, 1/N=1/12, 1/(N+1)=1/13, and F=4, and one divide-by-12 operation and four (F=4) divide-by-13 operations are performed, practicable AFT can be attained, though with a slightly lower degree of accuracy, yielding an error signal ratio of 0.14646% and an error signal frequency of 67.0 KHz.

For EUR, the intermediate frequency $f_P$ is 38.90 MHz and the reference frequency $f_{ref}$ is 4.4336175 MHz; so the ratio of the frequency, $f_P/f_{ref}$ is 8.77387. Now assuming that the total number of divisions, D=32, 1/N=1/8, 1/(N+1)=1/9, and the number of divide-by-(N+1) operations F=25, and also assuming that 7 divide-by-8 operations and 25 (F=25) divide-by-9 operations are performed with the 5-bit divider 22, then AFT with a high degree of accuracy can be achieved with an error signal ratio of 0.08411% and an error signal frequency of 32.72 KHz. Alternatively, even if the number of bits is reduced to 3, with D=4, 1/N=1/8, 1/(N+1)=1/9, and F=3, and one divide-by-8 operation and three (F=3) divide-by-9 operations are performed, practicable AFT can be implemented, though with a slightly lower degree of accuracy, resulting in an error signal ratio of 0.272% and an error signal frequency of 105.8 KHz.

Thus, according to the above-described automatic fine tuning circuit for television, because the standard 3.579454 MHz signal that is always employed in television sets used in Japan is utilized as the reference frequency, which is generated by a voltage controlled oscillator configured without any externally mounted coil and capacitor, automatic fine tuning (AFT) with a very high degree of accuracy can be implemented at low cost, without IC trimming and external adjustment. In addition, a problem of unwanted emission from coils and so on is completely eliminated. Furthermore, because the five T flip-flops T-FF0 through T-FF4 which comprise the main counter 31 are perfectly identical to the T flip-flops T-FF0A through T-FF4A which comprise the sub-counter 32, the layout can be simplified.

According to the voltage controlled oscillator circuit of the present invention, two outputs with 0° and 90° phases, respectively, can be obtained while providing stable oscillation with a constant oscillation frequency and amplitude, without using any externally mounted coil and capacitor. Thus, the need for mounting coils and capacitors on a PC board as conventionally done is completely eliminated, thus allowing for miniaturization of the PC board. In addition, because no problem related to unwanted emission from coils and so on arise, there is no possibility that it adversely affects the television audio signal tuner and the like, which, in turn, eliminates the need for shield and pattern design for preventing adverse effects of unwanted emission.

According to the automatic fine tuning circuit for television of the present invention, because divide-by-N and divide-by-(N+1) selected according to a ratio of the television IF frequency and reference frequency are performed multiple times, respectively, to output an average of both divisions as its divided frequency such that the average is close to the reference frequency, AFT with a very high degree of accuracy can be attained without increasing the division ratio.

What is claimed:

1. A voltage controlled oscillator circuit comprising:

a first loop for band-limiting an output signal of an amplifier through a bandpass filter, thereby providing oscillation at a frequency of a resonant point of the bandpass filter; and a second loop coupled to the first loop, the second loop for controlling oscillation amplitude, wherein a lowpass filter output with a 90° phase is extracted from the first loop, while a bandpass filter output with a 0° phase is extracted from the second loop, wherein the first loop has a first amplifier, a first filter connected to the output of the first amplifier, a second filter connected to the first filter, and a first feedback circuit for feeding back the output of the second filter to the input of the first amplifier, and wherein the second loop has a second amplifier for amplifying the output of the second filter, and a second feedback circuit for feeding back the output of the second amplifier to the input of the second filter.

2. A voltage controlled oscillator comprising:

a bandpass filter providing first and second bandpass filter signals;

a lowpass filter providing first and second lowpass filter signals;

a current amplifier coupled to both the bandpass filter and to the lowpass filter, the current amplifier for receiving the second bandpass filter signal and the second lowpass filter signal and for feeding back current amplifier first and second output signals to the bandpass filter and the lowpass filter, respectively, wherein a zero degree oscillation frequency output is produced across inputs to the current amplifier and ninety degree oscillation frequency output is produced between a first node in the bandpass filter and a second node in the lowpass filter.

3. A voltage controlled oscillator as claimed in claim 2, wherein the bandpass filter comprises a bandpass filter current amplifier, the lowpass filter comprises a lowpass filter current amplifier, and the bandpass filter current amplifier and the lowpass filter current amplifier are coupled to a control circuit for varying input voltage to the lowpass filter current amplifier and the bandpass filter current amplifier.

4. A voltage controlled oscillator as claimed in claim 3, wherein the bandpass filter and the lowpass filter each comprise a resistive/capacitive filter.

5. A voltage controlled oscillator as claimed in claim 4, wherein the lowpass filter comprises a first buffer amplifier coupled between the lowpass filter current amplifier and the resistive/capacitive filter.

6. A voltage controlled oscillator as claimed in claim 4, wherein the bandpass filter comprises a first buffer amplifier coupled between the bandpass filter current amplifier and the resistive/capacitive filter.

7. A voltage controlled oscillator as claimed in claim 5, wherein the lowpass filter comprises a second buffer amplifier coupled between the resistive/capacitive filter and the current amplifier.

8. A voltage controlled oscillator as claimed in claim 6, wherein the bandpass filter comprises a second buffer amplifier coupled between resistive/capacitive filter and the current amplifier.

* * * * *